US006771140B2

(12) United States Patent
Kikuta

(10) Patent No.: US 6,771,140 B2
(45) Date of Patent: Aug. 3, 2004

(54) HIGH-FREQUENCY MAGNETIC CERAMIC AND HIGH-FREQUENCY CIRCUIT COMPONENT

(75) Inventor: Hiroaki Kikuta, Rittou (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 10/257,792

(22) PCT Filed: Feb. 18, 2002

(86) PCT No.: PCT/JP02/01366

§ 371 (c)(1),
(2), (4) Date: Jan. 17, 2003

(87) PCT Pub. No.: WO02/069358

PCT Pub. Date: Sep. 6, 2002

(65) Prior Publication Data

US 2003/0197571 A1 Oct. 23, 2003

(30) Foreign Application Priority Data

Feb. 23, 2001 (JP) .................................... 2001-049071

(51) Int. Cl.$^7$ ................................................ H01P 1/32
(52) U.S. Cl. ................... 333/1.1; 333/24.2; 501/152
(58) Field of Search ............................. 333/1.1, 24.2; 501/152

(56) References Cited

U.S. PATENT DOCUMENTS 6,121,851 A * 9/2000 Takane et al. ............... 333/1.1
6,624,713 B2 * 9/2003 Matsunaga et al. .......... 333/1.1

FOREIGN PATENT DOCUMENTS

| EP | 0 737 987 | 10/1996 |
| JP | 2000-191368 | 7/2000 |
| JP | 2000191368 | * 11/2000 |

OTHER PUBLICATIONS

International Search Reported mailed Aug. 21, 2002.

G.A. Naziripour, et al., "Hot–pressed polycrystalline yttrium iron garnet," Journal of Mateials Science 20, Jan. 1985, pp. 375–380, No. 1, Great Britain.

Carl E. Patton, "Effective Linewidth due to Porosity and Anisotropy in Polycrystalline Yittrium Iron Garnet and Ca–V–Substituted Yittrium Iron Garnet at 10 Ghz," Physical Review, Mar. 1969, pp. 352–358, vol. 179, No. 2, Raytheon Research Division, Massachusetts.

L.R. Hodges, Jr., et al., "Magnetic and Microwave Properties of Calcium Vanadium–Substituted Garnets," Journal of Applied Physics, pp. 1085–1086, vol. 37, No. 3, Sperry Microwave Electronics Company, Florida Mar. 1966.

* cited by examiner

*Primary Examiner*—Benny Lee
*Assistant Examiner*—Stephen E. Jones
(74) *Attorney, Agent, or Firm*—Dickstein, Shapiro, Morin & Oshinsky, LLP.

(57) ABSTRACT

A high-frequency magnetic ceramic comprises garnet ferrite represented by the formula $A_ZB_{8-Z}O_{12}$ wherein the site A comprises yttrium and the site B comprises iron, where Z is in the range of more than 3.00 to 3.09. The relative density of the high-frequency magnetic ceramic is at least 95%, the average grain diameter is at least 3 μm, and the 3σ value of the grain diameters is 2 μm or less wherein σ represents the standard deviation of the grain diameters. A high-frequency circuit component includes microwave magnetic composites composed of the high-frequency magnetic ceramic and central electrodes that are mutually insulated.

18 Claims, 1 Drawing Sheet

HIGH-FREQUENCY MAGNETIC CERAMIC AND HIGH-FREQUENCY CIRCUIT COMPONENT

TECHNICAL FIELD

The present invention relates to magnetic ceramics that have low loss and that can be used in higher frequencies (hereinafter referred to as "high-frequency magnetic ceramic"). The present invention also relates to high-frequency circuit components including the magnetic ceramics. The high-frequency circuit components function as non-reciprocal circuit elements such as circulators and isolators.

BACKGROUND ART

For several years, as seen in the expanding mobile communication market, higher frequencies have been used in information and communication fields with trends toward higher communication rates and densities. Typical high-frequency circuit components (hereinafter referred to as "circuit components") used in these fields are non-reciprocal circuit elements such as circulators and isolators. Increasing requirements for these circuit components are lower loss, smaller sizes, broader bands, and lower prices.

Compact mobile communication devices such as portable phones require circuit components having low loss so that they can be driven by batteries for longer times. Yttrium-iron-based garnet materials having high electrical resistances and low loss at high frequencies are used in high-frequency magnetic ceramics for the mobile communication devices.

In general, the high-frequency magnetic ceramics must satisfy the following characteristics: a desired saturation magnetization Ms depending on the frequency to be used; a high curie temperature Tc, a small half width ΔH of ferromagnetic resonance magnetic field, and a small dielectric loss. It is preferable that the half width ΔH be smaller to achieve circuit components with low loss.

Unfortunately, it is difficult to appropriately control the saturation magnetization Ms depending on the frequency used without an increase in the half width ΔH. In other words, no known high-frequency magnetic ceramics satisfy the above characteristics, and thus, high-frequency circuit components including the high-frequency magnetic ceramics do not show satisfactory characteristics. According to the investigation by the present inventors, the half width ΔH in known high-frequency magnetic ceramics significantly increases depending on their compositions, relative densities, average crystal grain diameters, and 3σ wherein σ represents the standard deviation of the grain diameters, so that the magnetic ceramics cause often troubles in use.

Accordingly, an object of the present invention is to provide a high-frequency magnetic ceramic that has a small half width ΔH and a desired saturation magnetization Ms.

Another object of the present invention is to provide a high-frequency circuit component having superior electrical characteristics such as low loss.

Disclosure of Invention

A high-frequency magnetic ceramic comprises garnet ferrite represented by the formula $A_ZB_{8-Z}O_{12}$ wherein the site A comprises yttrium and the site B comprises iron, wherein Z is in the range of more than 3.00 to 3.09, the relative density (the ratio of the density of the sintered ceramic to the theoretical density) of the high-frequency magnetic ceramic is at least 95%, the average grain diameter is at least 3 μm, and the 3σ value of the grain diameters is 2 μm or less wherein σ represents the standard deviation of the grain diameters. Preferably, the site A further comprises calcium and the site B further comprises indium and vanadium.

In case of Z<3.00, the half width ΔH undesirably increases compared with the case of Z=3.00 which is the stoichiometric value in the formula.

Also in case of Z>3.09, the half width ΔH undesirably increases compared with the case of Z=3.00. Thus, Z is in the range of more than 3.00 to 3.09 in the present invention. At a relative density of less than 95%, the magnetic ceramic has many pores. Magnetic poles occurring around the pores generate a demagnetization field, which extends a resonance magnetic field, resulting in an increase in half width ΔH. Thus, the relative density in the present invention is at least 95%.

At an average grain diameter of less than 3 μm, each crystal grain has a large anisotropic magnetic field, resulting in an increase in half width ΔH. Thus, the average grain diameter in the present invention is at least 3 μm. In case of comparing several sintered ceramics having the same average grain diameter with each other, a 3σ value exceeding 2 μm causes noticeable magnetic field nonuniformity which extends the resonance magnetic field, resulting in an increase in half width ΔH. Thus, the 3σ value in the present invention is 2 μm or less.

As described above, in the present invention, Z is in the range of more than 3.00 to 3.09, the relative density is at least 95%, the average grain diameter is at least 3 μm, and the 3σ value of the grain diameters is 2 μm or less. In a magnetic ceramic satisfying these conditions, the saturation magnetization Ms can be controlled over a wide range, while maintaining a small half width ΔH. Thus, a high-frequency circuit component having such a configuration exhibits low loss in higher frequencies.

In case that the site A in the formula further comprises calcium and the site B further comprises indium and vanadium, the molar ratio Ca/Y of calcium to yttrium in the site A is preferably in the range of 0.266 to 0.351. At a molar ratio outside of this range, foreign phases are generated in the primary phase represented by the above formula, resulting in the upward tend of the half width ΔH.

Preferably, the site B in the formula comprises 4.517 to 4.607 moles of iron, 0.04 to 0.08 mole of indium, and 0.30 to 0.36 mole of vanadium. If any one of these elements is outside of the above range, foreign phases are generated in the primary phase represented by the above formula, resulting in the upward tend of the half width ΔH. More preferably, the site B comprises 4.517 to 4.607 moles of iron, 0.060 mole of indium, and 0.333 mole of vanadium.

In case that the site A in the formula further comprises calcium and the site B further comprises vanadium, the molar ratio Ca/V of calcium to vanadium is preferably in the range of 2.00 to 2.40 and more preferably in the range of 2.01 to 2.40. At a molar ratio within this range, the green magnetic ceramic can be sintered at lower temperatures and the resulting sintered magnetic ceramic exhibits low loss.

A high-frequency circuit component according to the present invention comprises a main body comprising the above high-frequency magnetic ceramic; a plurality of central conductors that intersect each other and are electrically insulated from each other in the main body; and a magnetic field generator for applying a DC magnetic field to the main body and the central conductors.

In this configuration, the electric field of microwave power in the main body of the high-frequency circuit component can be controlled by adjusting the magnitude and the vector of the DC magnetic field; thus, microwave power input from a central conductor (first central conductor) can be output through another central conductor or the other central conductors.

Furthermore, microwave power input from another central conductor (second central conductor) can also be output through another central conductor or the other central conductors (including the first central conductor in this case).

Accordingly, the above configuration is applicable to non-reciprocal circuit elements such as circulators and isolators.

BEST MODE FOR CARRYING OUT THE INVENTION

Figure 1:
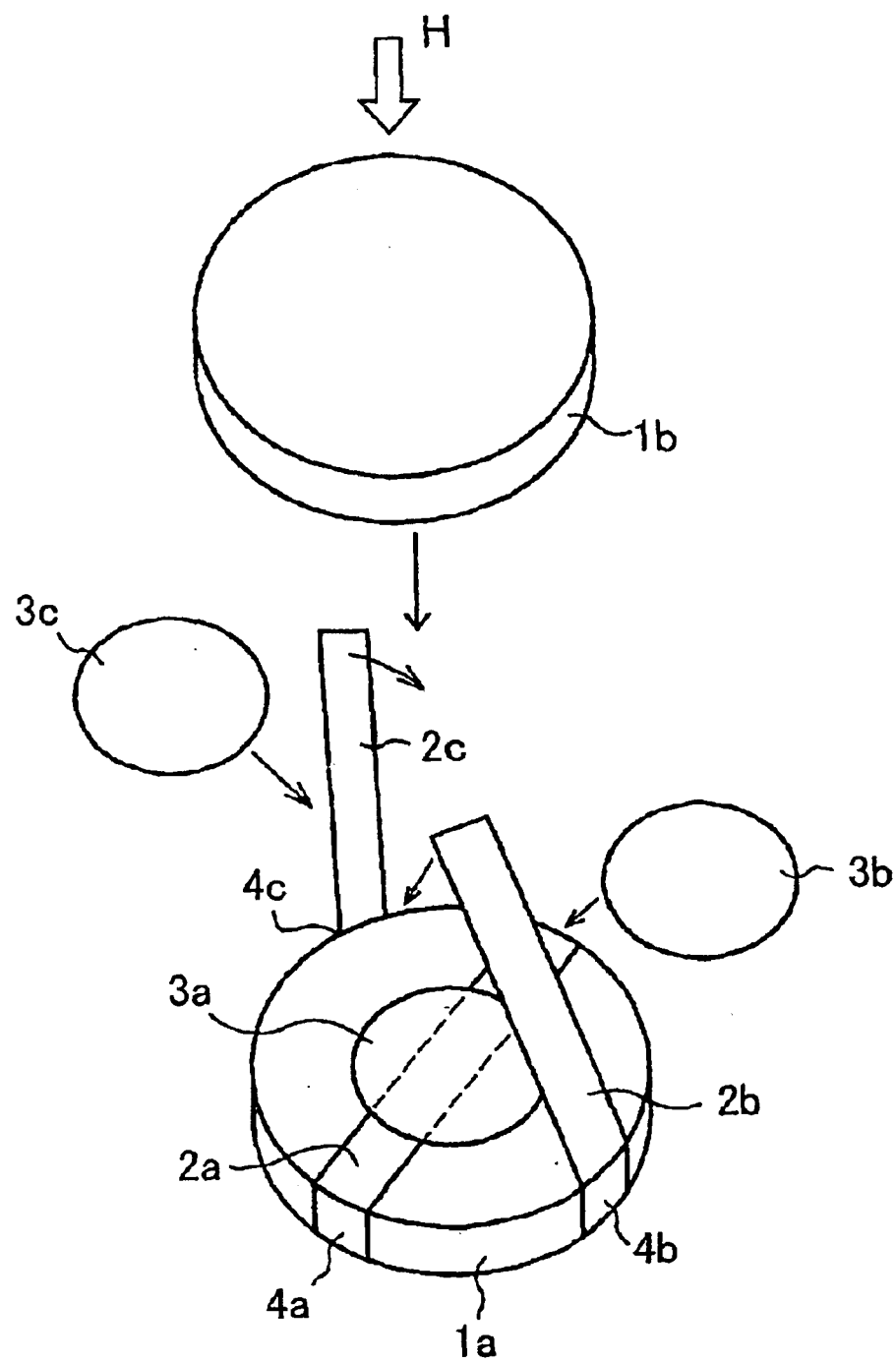
FIG. 1 is an exploded isometric view of a high-frequency circuit component including a high-frequency magnetic ceramic according to the present invention.

A non-reciprocal circuit element for microwaves according to the present invention will now be described. Referring to FIG. 1, the non-reciprocal circuit element includes a disk magnetic composite 1a for microwaves (hereinafter referred to as "microwave magnetic composite") composed of the high-frequency magnetic ceramic according to the present invention. The microwave magnetic composite 1a has electrical insulation. The diameter and thickness of the microwave magnetic composite 1a can be determined according to the frequency used and input impedance.

The microwave magnetic composite 1a is provided with a central electrode or central conductor 2a of a metal foil strip composed of, for example, copper, thereon. The central conductor 2a extends in the radial direction from a position at the edge through the center of the upper surface (a face in the axis direction) of the microwave magnetic composite 1a.

An insulating film 3a having smaller diameter than that of the microwave, magnetic composite 1a and having electrical insulation is provided on the central conductor 2a so that the insulating film 3a and the microwave magnetic composite 1a are coaxially arranged. Another central conductor 2b is provided in the same manner as that in the central conductor 2a such that the central conductor 2b intersects the central conductor 2a.

Similarly, an insulating film 3b, a central conductor 2c, and an insulating film 3c are arranged, in that order, on the central conductor 2b. Another insulation film (not shown in the drawing) is also provided between the microwave magnetic composite 1a and the central conductor 2a. Another microwave magnetic composite 1b is coaxially arranged on the microwave magnetic composite 1a. The microwave magnetic composite 1b also comprises the high-frequency magnetic ceramic according to the present invention. Crossing angles between these central conductors 2a, 2b, and 2c are preferably equal to each other in order to maximize the functions of circulators and isolators including this non-reciprocal circuit element.

Permanent magnets (not shown) as a magnetic field generator are disposed on the top and bottom of this structure including the microwave magnetic composites 1a and 1b to apply a DC magnetic field to the structure in the axis direction.

In other words, this non-reciprocal circuit element includes the microwave magnetic composites 1a and 1b formed of the high-frequency magnetic ceramic of the present invention to control the electric field distribution. Furthermore, the central conductors 2a, 2b, and 2c are provided between the microwave magnetic composites 1a and 1b and separated by the insulating films 3a and 3b. These central conductors 2a, 2b, and 2c intersect each other. The external magnets are also provided to apply a DC magnetic field H to these central conductors 2a, 2b, and 2c.

In this non-reciprocal circuit element, for example, microwave power is input from a terminal 4a arranged at a position of the side of the microwave magnetic composite 1a and connected with the central conductor 2a and is output from another terminal 4b arranged at another position of the side and connected with the central conductor 2b, thus functioning as a circulator.

When a resistive terminator is connected to, for example, a terminal 4c of the central conductor 2c of this non-reciprocal circuit element, the microwave power input from the terminal 4b of the central conductor 2b is output from the terminal 4c *and is completely absorbed by the resistive terminator, thus functioning as an isolator, which conducts forward microwaves but does not conduct backward microwaves.*

Since the non-reciprocal circuit element includes the high-frequency magnetic ceramic, which can have a desired saturation magnetization Ms while maintaining a small half width ΔH, this element has low loss in a higher-frequency environment. Though the microwave magnetic composites 1a and 1b are discoid in this embodiment, another shape such as trigonal may be employed in the present invention.

The non-reciprocal circuit element in this embodiment is of a stacking type. The non-reciprocal circuit element may be of an integrated type in the present invention. In such a case, the central conductors 3a, 3b, and 3c and the insulating films 2a, 2b, and 2c are integrally formed on the microwave magnetic composite 1a or 1b.

The embodiments of the high-frequency magnetic ceramic according to the present invention will now be described with reference to the drawing and EXAMPLES. Materials for the high-frequency magnetic ceramic is known in documents, for example, Carl E. Patton, "Effective Linewidth due to Porosity and Anisotropy in Polycrystalline Yttrium Iron Garnet and Ga-V-Substituted Yttrium Iron Garnet at 10 GHz"; Phys. Rev., pp. 352–358, Vol. 179, No. 2 (1969) and is represented by the formula $(Ca,Y)_3(Fe,V)_5O_{12}$.

EXAMPLE 1

Powdered materials having different compositions for the high-frequency magnetic ceramic according to the present invention was prepared as follows. Using $CaCO_3$, $Y_2O_3$, $Fe_2O_3$, $In_2O_3$, and $V_2O_5$ powders having at least 99% purity were compounded according to the formulations shown in Table 1 so that each composition was represented by the formula $(Ca_XY_{Z-X})(Fe_{8-Z-Y-W}In_WV_y)O_{12}$, which corresponds to the formula $A_ZB_{8-Z}O_{12}$ where A=Ca and Y, and B=Fe, In, and V.

Each powdered material was wet-mixed by a ball mill process and was calcined at a temperature of 900° C. to 1,200° C. The calcined powder was pulverized and was mixed with a binder. The mixture was dried and granulated. The granules were shaped into a disk with a diameter of 8 mm and a thickness of 1 mm by press molding. The disk was fired at 1,200° C. to 1,400° C. for 5 hours to prepare a high-frequency magnetic ceramic. In the resulting high-frequency magnetic ceramics, the relative density was at least 95%, the average grain diameter was at least 2 μm, and the 3σ value of the grain diameters was 2 μm or less.

The dependence of half width $\Delta H$ on Z was examined. The half width $\Delta H$ of the high-frequency magnetic ceramic was measured according to Japanese Industrial Standard (JIS)-C2565. The saturation magnetization Ms was measured a vibrating sample magnetometer.

Table 1 show that the half width $\Delta H$ of Samples 3 to 11 where $3.00 < Z \leq 3.09$ is smaller than the half width $\Delta H$ of Sample 2 where Z=3.0 (stoichiometric value).

The half width $\Delta H$ of Sample 1 where Z<3.00 is larger than that of stoichiometric Sample 2. Also, the half width $\Delta H$ of Sample 12 where Z>3.09 is larger than that of stoichiometric Sample 2. According to these results, the range of Z is preferably $3.00 < Z \leq 3.09$ and more preferably $3.04 < Z \leq 3.06$.

TABLE 1

| | Composition: $A_Z B_{8-Z} O_{12}$ where A = Ca and Y, and B = Fe, In, and V | | | | | |
|---|---|---|---|---|---|---|
| | $(Ca_X Y_{Z-X})(Fe_{8-Z-Y-W} In_W V_Y)O_{12}$ | | | | $\Delta H$ | Ms |
| Sample | Z | X | W | Y | (kA/m) | (mT) |
| 1 | 2.99 | 0.66 | 0.06 | 0.33 | 3.03 | 127.2 |
| 2 | 3.00 | | | | 2.79 | 128.0 |
| 3 | 3.01 | | | | 2.55 | 128.8 |
| 4 | 3.02 | | | | 2.31 | 129.6 |
| 5 | 3.03 | | | | 2.15 | 130.4 |
| 6 | 3.04 | | | | 1.91 | 131.2 |
| 7 | 3.05 | | | | 1.83 | 132.0 |
| 8 | 3.06 | | | | 1.83 | 132.8 |
| 9 | 3.07 | | | | 2.15 | 133.6 |
| 10 | 3.08 | | | | 2.39 | 134.4 |
| 11 | 3.09 | | | | 2.63 | 135.2 |
| 12 | 3.10 | | | | 2.87 | 136.0 |

EXAMPLE 2

Powdered materials having the same composition $(Ca_{0.66} Y_{2.38})(Fe_{4.57} In_{0.06} V_{0.33})O_{12}$ (Z=3.04) were calcined and fired at under different conditions to prepare Samples 13 to 21, which were different from each other in the relative density, the average grain diameter, and the $3\sigma$ value of the grain diameters of the high-frequency magnetic ceramic as shown in Table 2.

The relative density was the ratio of the density of the sintered compact determined by an Archimedes balanced method to the theoretical density determined by the weight per unit cell and lattice constant according to X-ray diffractometry.

The average grain diameter was determined by observing crystal grains on a polished surface of each sintered compact by scanning electron microscopy, by calculating and evaluating the diameters, converted into circles, of these grains. The $3\sigma$ value of the grain diameters was determined on the assumption that the grain diameters were normally distributed.

Table 2 shows that Sample 13 having a relative density of less than 95%, Sample 17 having an average grain diameter of less than 3 $\mu$m, and Sample 21 having a $3\sigma$ value exceeding 2 $\mu$m have half widths $\Delta H$ larger than 1.91 kA/m.

In contrast, Samples 14, 15, 16, 18, 19, and 20 each having a relative density of larger than 95%, an average grain diameter exceeding 3 $\mu$m, and a $3\sigma$ value of less than 2 $\mu$m have half widths $\Delta H$ of 1.91 kA/m or less.

These results show that the relative density is preferably at least 95% and more preferably at least 99%, that the average grain diameter is preferably at least 3 $\mu$m and more preferably at least 6 $\mu$m, and that the $3\sigma$ value is preferably 2 $\mu$m or less and more preferably 1 $\mu$m or less.

TABLE 2

| Sample | Relative Density (%) | Average Grain Diameter ($\mu$m) | $3\sigma$ of Grain Diameters ($\mu$m) | $\Delta H$ (kA/m) | MS (mT) |
|---|---|---|---|---|---|
| 13 | 94.0 | 3 | 1.0 | 3.67 | 128.0 |
| 14 | 99.0 | 3 | 1.0 | 1.91 | 130.0 |
| 15 | 99.5 | 3 | 1.0 | 1.75 | 131.0 |
| 16 | 99.9 | 3 | 1.0 | 1.51 | 131.0 |
| 17 | 99.5 | 1 | 1.0 | 2.39 | 131.0 |
| 18 | 99.5 | 10 | 1.0 | 1.75 | 131.0 |
| 19 | 99.5 | 30 | 1.0 | 1.51 | 131.0 |
| 20 | 99.5 | 3 | 1.0 | 1.75 | 131.0 |
| 21 | 99.5 | 3 | 2.5 | 2.55 | 131.0 |

EXAMPLE 3

High-frequency magnetic ceramics represented by the formula $(Ca,Y)_Z(Fe,In,V)_{8-Z} O_{12}$ having a common Z value and variable Ca contents were prepared and subjected to measurements of half width $\Delta H$ and the saturation magnetization Ms as in EXAMPLE 1. The results are shown in Table 3.

Table 3 shows that, in the formula $(Ca_X Y_{Z-X})(Fe_{8-Z-Y-W} In_W V_y)O_{12}$, which corresponds to the substitution of pure yttrium-iron garnet ($Y_3 Fe_5 O_{12}$=YIG), the saturation magnetization Ms can be modified without an increased half width $\Delta H$ by varying the calcium content (X).

Y (=calcium content) is equal to X/2 by charge compensation and W (=indium content) is fixed; hence, the composition can be changed by X. A high-frequency magnetic ceramic having a required Ms without a decreased half width $\Delta H$ can be readily formed by varying X.

TABLE 3

| | Composition: $A_Z B_{8-Z} O_{12}$ where A = Ca and Y, and B = Fe, In, and V | | | | | |
|---|---|---|---|---|---|---|
| | $(Ca_X Y_{Z-X})(Fe_{8-Z-Y-W} In_W V_y)O_{12}$ | | | | $\Delta H$ | Ms |
| Sample | Z | X | W | Y | (kA/m) | (mT) |
| 22 | 3.04 | 0.60 | 0.06 | 0.30 | 1.91 | 137.3 |
| 23 | 3.04 | 0.62 | | 0.31 | 1.91 | 135.2 |
| 24 | 3.04 | 0.64 | | 0.32 | 1.91 | 133.1 |
| 25 | 3.04 | 0.66 | | 0.33 | 1.91 | 131.2 |
| 26 | 3.04 | 0.68 | | 0.34 | 1.91 | 129.2 |
| 27 | 3.04 | 0.70 | | 0.35 | 1.91 | 127.2 |

As described above, the high-frequency magnetic ceramic according to the present invention is of a garnet ferrite type represented by $A_Z B_{8-Z} O_{12}$ wherein A is at least one metallic element containing Y as the essential element, B is at least one metallic element containing Fe as the essential element, Z is in the range of $3.00 < Z \leq 3.09$, the relative density is at least 95%, the average grain diameter is at least 3 $\mu$m, and the $3\sigma$ value of the grain diameters is 2 $\mu$m or less wherein $\sigma$ represents the standard deviation of the grain diameters. By controlling Z within the range of $3.00 < Z \leq 3.09$, the half width $\Delta H$ can be reduced compared with that at the stoichiometric Z value (3.0). Furthermore, by controlling the relative density, the average grain diameter, and the $3\sigma$ value as described above, the half width $\Delta H$ can be further reduced.

The saturation magnetization Ms can be varied to a desired value while maintaining a small half width $\Delta H$ value by changing the formulations of the A and B sites in the formula. Thus, non-reciprocal circuit elements for high frequencies and particularly microwaves such as isolators and circulators including the high-frequency magnetic ceramic exhibit low loss in higher frequency environments.

The high-frequency circuit component according to the present invention has a main body of the above high-frequency magnetic ceramic. A plurality of central conductors intersects each other while maintaining mutual electrical insulation in the main body. A DC magnetic field is applied to the main body and the central conductors through a magnetic field generator.

This high-frequency circuit component can be used as a non-reciprocal circuit element, for example, an isolator or a circulator in high frequencies and particularly microwave frequencies. The high-frequency circuit component exhibits low loss in higher frequency environments.

Industrial Applicability

The high-frequency circuit component of the present invention has low loss in a higher-frequency environment, and can be preferably used in non-reciprocal circuit elements such as circulators and isolators.

What is claimed is:

1. A high-frequency magnetic ceramic comprising garnet ferrite represented by the formula $A_ZB_{8-2}O_{12}$ wherein the site A comprises yttrium and the site B comprises iron, wherein Z is in the range of more than 3.00 to 3.09, the relative density of the high-frequency magnetic ceramic is at least 95%, the overage grain diameter is at least 3 $\mu$m, and the 3$\sigma$ value of the grain diameters is 2 $\mu$m or less wherein the relative density represents the ratio of the density of the sintered ceramic to the theoretical density and $\sigma$ represents the standard deviation of the grain diameters.

2. The high-frequency magnetic ceramic according to claim 1, wherein the site A further comprises calcium and the site B further comprises indium and vanadium.

3. The high-frequency magnetic ceramic according to claim 2, wherein the molar ratio Ca/y of calcium to yttrium in the site A is in the range of 0.266 to 0.351.

4. A high-frequency circuit component comprising:
a main body comprising the high-frequency magnetic ceramic according to claim 3;
a plurality of central conductors that intersect each other and are electrically insulated from each other in the main body; and
a magnetic field generator adapted to apply a DC magnetic field to the main body and the central conductors.

5. The high-frequency magnetic ceramic according to claim 2, wherein the site B comprises 4.517 to 4.607 moles of iron, 0.04 to 0.08 mole of indium, and 0.30 to 0.36 mole of vanadium.

6. A high-frequency circuit component comprising:
a main body comprising the high-frequency magnetic ceramic according to claim 5;
a plurality of central conductors that intersect each other and are electrically insulated from each other in the main body; and
a magnetic field generator adapted to apply a DC magnetic field to the main body and the central conductors.

7. The high-frequency magnetic ceramic according to claim 5, wherein the molar ratio Ca/Y of calcium to yttrium in the site A is in the range of 0.266 to 0.351.

8. A high-frequency circuit component comprising:
a main body comprising the high-frequency magnetic ceramic according to claim 2;
a plurality of central conductors that intersect each other and are electrically insulated from each other in the main body; and
a magnetic field generator adapted to apply a DC magnetic field to the main body and the central conductors.

9. A high-frequency circuit component comprising:
a main body comprising the high-frequency magnetic ceramic according to claim 2;
a plurality of central conductors that intersect each other and are electrically insulated from each other in the main body; and
a magnetic field generator adapted to apply a DC magnetic field to the main body and the central conductors.

10. The high-frequency magnetic ceramic according to claim 9, wherein the site B comprises 4.517 to 4.607 moles of iron, 0.06 mole of indium, and 0.333 mole of vanadium.

11. The high-frequency magnetic ceramic according to claim 10, wherein Z is in the range of more than 3.04 to 3.06, the relative density of the high-frequency magnetic ceramic is at least 99%, the average grain diameter is at least 6 $\mu$m, and the 3 $\sigma$ value of the grain diameters is 1 $\mu$m or less wherein the relative density represents the ratio of the density of the sintered ceramic to the theoretical density and $\sigma$ represents the standard deviation of the grain diameters.

12. A frequency circuit component comprising:
a main body comprising the high-frequency magnetic ceramic according to claim 9;
a plurality of central conductors that intersect each other and are electrically insulated from each other in the main body; and
a magnetic field generator adapted to apply a DC magnetic field to the main body and the central conductors.

13. The high-frequency magnetic ceramic according to claim 11, wherein the molar ratio Ca/V is in the range of 2 to 2.40.

14. A high-frequency circuit component comprising:
a main body comprising high-frequency magnetic ceramic according to claim 13;
a plurality of central conductors that intersect each other and are electrically insulated from each other in the main body; and
a magnetic field generator adapted to apply a DC magnetic field to the main body and the central conductors.

15. The high-frequency magnetic ceramic according to claim 13, wherein the molar ratio Ca/V is in the range of 2.01 to 2.40.

16. A high-frequency circuit component comprising:
a main body comprising the high-frequency magnetic ceramic according to claim 15,
a plurality of central conductors that intersect each other and are electrically insulated from each other in the main body; and
a magnetic field generator adapted to apply a DC magnetic field to the main body and the central conductors.

17. The high-frequency magnetic ceramic according to claim 1, wherein Z is in the range of more than 3.04 to 3.06, the relative density of the high-frequency magnetic ceramic is at least 99%, the average grain diameter is at least 6 $\mu$m, and the 3$\sigma$ value of the grain diameters is 1 $\mu$m or less wherein the relative density represents the ratio of the density of the sintered ceramic to the theoretical density and $\sigma$ represents the standard deviation of the grain diameters.

18. A high-frequency circuit component comprising:
a main body comprising the high-frequency magnetic ceramic according to claim 1;
a plurality of central conductors that intersect each other and are electrically insulated from each other in the main body; and
a magnetic field generator adapted to apply a DC magnetic field to the main body and the central conductors.

* * * * *